(12) United States Patent
Chen

(10) Patent No.: US 11,742,863 B2
(45) Date of Patent: Aug. 29, 2023

(54) PHASE-LOCKED LOOP CIRCUIT

(71) Applicant: HUAWEI TECHNOLOGIES CO., LTD., Guangdong (CN)

(72) Inventor: Yanqin Chen, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/901,971

(22) Filed: Sep. 2, 2022

(65) Prior Publication Data
US 2022/0416793 A1     Dec. 29, 2022

Related U.S. Application Data

(63) Continuation of application No. PCT/CN2020/077644, filed on Mar. 3, 2020.

(51) Int. Cl.
*H03L 7/089*     (2006.01)
*H03L 7/099*     (2006.01)

(52) U.S. Cl.
CPC .......... *H03L 7/0891* (2013.01); *H03L 7/0995* (2013.01)

(58) Field of Classification Search
CPC ............................ H03L 7/0891; H03L 7/0995
See application file for complete search history.

(56) References Cited

U.S. PATENT DOCUMENTS

| | | |
|---|---|---|
| 7,019,571 B2 | 3/2006 | Lim |
| 8,183,900 B2 | 5/2012 | Lamanna et al. |
| 8,704,564 B2 | 4/2014 | Hasegawa et al. |
| 9,048,848 B2 * | 6/2015 | Chen ........................ H03L 7/103 |
| 10,326,458 B2 * | 6/2019 | Liang ....................... H03L 7/104 |
| 10,715,155 B1 * | 7/2020 | Parvizi ..................... H03L 7/089 |
| 10,826,501 B1 * | 11/2020 | Coban ................... H03L 7/0995 |
| 10,998,908 B2 * | 5/2021 | Lin ........................ H03L 7/0893 |
| 2004/0053591 A1 * | 3/2004 | Lin ....................... H03L 7/0891 |
| | | 455/84 |
| 2005/0280453 A1 | 12/2005 | Hsieh |
| 2008/0042759 A1 | 2/2008 | Watanabe |

(Continued)

FOREIGN PATENT DOCUMENTS

| | | |
|---|---|---|
| CN | 101944910 A | 1/2011 |
| CN | 110233621 A | 9/2019 |

(Continued)

OTHER PUBLICATIONS

Extended European Search Report for EP Application No. 20922722 dated Mar. 16, 2023, 13 pages.

(Continued)

*Primary Examiner* — Adam D Houston

(57) ABSTRACT

The technology of this application relates to a phase-locked loop circuit that includes a phase frequency detector, a first voltage control module, a second voltage control module, a third voltage control module, a voltage-controlled oscillator, and a frequency divider. A first output end of the phase frequency detector is connected to a first input end of the first voltage control module and a first input end of the second voltage control module, a second output end of the phase frequency detector is connected to a second input end of the first voltage control module and a second input end of the second voltage control module, an output end of the first voltage control module.

17 Claims, 9 Drawing Sheets

(56) References Cited

U.S. PATENT DOCUMENTS

| | | | |
|---|---|---|---|
| 2010/0052746 A1 | 3/2010 | Park et al. | |
| 2019/0268006 A1* | 8/2019 | Hiraku | H03L 7/1075 |
| 2022/0131546 A1* | 4/2022 | Choi | H03L 7/0893 |
| 2022/0360270 A1* | 11/2022 | Jung | H03L 7/113 |
| 2023/0092886 A1* | 3/2023 | Shen | H03L 7/081 327/157 |

FOREIGN PATENT DOCUMENTS

| | | | | |
|---|---|---|---|---|
| CN | 209642645 U | 11/2019 | | |
| EP | 2458773 B1 | 1/2019 | | |
| JP | 2002185315 A | 6/2002 | | |
| WO | WO-02095948 A2 * | 11/2002 | | H03C 3/0925 |

OTHER PUBLICATIONS

International Search Report and Written Opinion issued in PCT/CN2020/077644, dated Dec. 16, 2020, 11 pages.

* cited by examiner

PHASE-LOCKED LOOP CIRCUIT

CROSS-REFERENCE TO RELATED APPLICATIONS

This application is a continuation of International Application No. PCT/CN2020/077644, filed on Mar. 3, 2020, the disclosure of which is hereby incorporated by reference in its entirety.

TECHNICAL FIELD

Embodiments of this application relate to the field of electronic technologies, and in particular, to a phase-locked loop circuit.

BACKGROUND

A phase-locked loop is an important electronic device used to lock a phase, and is widely used in the field of electronic technologies.

Generally, a phase-locked loop circuit may include a phase detector, a charge pump, a low-pass filter, an oscillator, and a frequency divider. According to a loop stability principle of the phase-locked loop, a zero frequency of the phase-locked loop is far less than bandwidth of the phase-locked loop, and the bandwidth of the phase-locked loop cannot be set too high either. In the existing phase-locked loop circuit, the zero frequency of the phase-locked loop is related to a filter resistor and a filter capacitor in the low-pass filter, and is specifically denoted as: $\omega_Z = 1/R*C_1$, where $\omega_Z$ is the zero frequency of the phase-locked loop, R is a resistance value of the filter resistor, and $C_1$ is a capacitance value of the filter capacitor. The bandwidth of the phase-locked loop is related to an output current of the charge pump, the filter resistor, a frequency-to-voltage conversion rate of the oscillator, and a frequency division ratio of the frequency divider, and is specifically denoted as: $BW = I_{CP}*R*K_{VCO}/N_{DIV}*2\pi$, where BW is the bandwidth of the phase-locked loop, $I_{CP}$ is the output current of the charge pump, R is a resistance value of the filter resistor, $K_{VCO}$ is the frequency-to-voltage conversion rate of the oscillator, and $N_{DIV}$ is the frequency division ratio of the frequency divider. With reference to the foregoing formula, the capacitance value of the filter capacitor and/or the resistance value of the filter resistor may be increased to make the zero frequency $\omega_Z$ of the phase-locked loop smaller, and a larger capacitance value of the filter capacitor may make an area of the entire phase-locked loop circuit to increase, resulting in higher manufacturing costs of the phase-locked loop. Therefore, if the area of the phase-locked loop is not increased, the resistance value of the filter resistor may be increased to decrease $\omega_Z$. However, when the resistance value of the filter resistor is increased, the bandwidth of the phase-locked loop is accordingly increased. Therefore, when the resistance value of the filter resistor is increased, the output current of the charge pump may be decreased to ensure that the bandwidth of the phase-locked loop is not increased.

However, the decreasing of the output current of the charge pump may increase in-band noise of the phase-locked loop, resulting in poor stability of the phase-locked loop.

SUMMARY

Embodiments of this application provide a phase-locked loop circuit, to effectively reduce noise of a phase-locked loop without increasing an area of the phase-locked loop, so that quality of an output signal of the phase-locked loop is improved.

To achieve the foregoing objectives, the following technical solutions are used in embodiments of this application.

According to a first aspect, an embodiment of this application provides a phase-locked loop circuit, including a phase frequency detector, a first voltage control module, a second voltage control module, a third voltage control module, a voltage-controlled oscillator, and a frequency divider. A first output end of the phase frequency detector is connected to a first input end of the first voltage control module and a first input end of the second voltage control module, a second output end of the phase frequency detector is connected to a second input end of the first voltage control module and a second input end of the second voltage control module, an output end of the first voltage control module and an output end of the second voltage control module are separately connected to an input end of the third voltage control module, an output end of the third voltage control module is connected to an input end of the voltage-controlled oscillator, an output end of the voltage-controlled oscillator is connected to an input end of the frequency divider, and an output end of the frequency divider is connected to an input end of the phase frequency detector.

The phase frequency detector is configured to output an upper signal from the first output end of the phase frequency detector based on an input reference signal and an input feedback signal, and output a down signal from the second output end of the phase frequency detector.

The first voltage control module is configured to output a low-frequency component of a reference control voltage based on the upper signal and the down signal output by the phase frequency detector.

The second voltage control module is configured to output a high-frequency component of the reference control voltage based on the upper signal and the down signal output by the phase frequency detector.

The third voltage control module is configured to adjust the high-frequency component of the reference control voltage and the low-frequency component of the reference control voltage to obtain a target control voltage, where the target control voltage is processed by the voltage-controlled oscillator and the frequency divider to obtain the feedback signal.

In a possible implementation, the first voltage control module is specifically configured to generate, driven by the upper signal and the down signal output by the phase frequency detector, a charge current or a discharge current, filter out a high-frequency component of the charge current or the discharge current, and output the low-frequency component of the reference control voltage.

In a possible implementation, the second voltage control module is specifically configured to perform coupling processing on the upper signal and the down signal output by the phase frequency detector, and output the high-frequency component of the reference control voltage, where the coupling processing enables the high-frequency component of the reference control voltage to increase as high-level duration of the upper signal increases, and enables the high-frequency component of the reference control voltage to decrease as the high-level duration of the down signal increases.

In a possible implementation, the phase frequency detector is specifically configured to detect a phase difference between the reference signal and the feedback signal, output the upper signal from the first output end of the phase frequency detector, and output the down signal from the second output end of the phase frequency detector.

In a possible implementation, the voltage-controlled oscillator is configured to control a frequency of an output signal of the voltage-controlled oscillator based on the target control voltage.

In a possible implementation, the frequency divider is configured to perform frequency division on the output signal of the voltage-controlled oscillator to obtain the feedback signal.

In this embodiment of this application, noise of the phase-locked loop circuit includes noise caused by a high-frequency signal and noise caused by a low-frequency signal. The noise caused by the low-frequency signal may usually be attenuated by the phase-locked loop circuit to filter out, that is, the noise caused by the low-frequency signal in the phase-locked loop circuit may be ignored. In other words, it is considered that the noise caused by the low-frequency signal does not affect quality of an output signal of the phase-locked loop circuit. In this embodiment of this application, the low-frequency component and the high-frequency component of the reference control voltage in the phase-locked loop are separately output by using different voltage control circuits. The second voltage control module performs coupling processing on the UP signal and the DN signal to output the high-frequency component of the reference control voltage, and then the high-frequency component is adjusted by the third voltage control module, so that the noise caused by the high-frequency signal (that is, the high-frequency component) can be better suppressed. According to the phase-locked loop circuit provided in this embodiment of this application, noise of the phase-locked loop can be effectively reduced, and quality of the output signal of the phase-locked loop can be improved. In addition, the phase-locked loop circuit provided in this embodiment of this application does not increase an area of the phase-locked loop. In addition, in a specific implementation, the area of the phase-locked loop may be reduced by adjusting a parameter of an electronic component in the phase-locked loop circuit, to facilitate implementation of an integration process. In conclusion, according to the technical solutions provided in the embodiments of this application, noise of the phase-locked loop can be effectively reduced without increasing the area of the phase-locked loop, and stability of the output signal of the phase-locked loop can be improved.

Further, a fluctuation of the reference control voltage (which is a fluctuation or a variation in a unit time in this embodiment of this application) affects the frequency of the output signal of the voltage-controlled oscillator. In the third voltage control module, the target control voltage fluctuates with the fluctuation of the reference control voltage, and a ratio of a variation of the target control voltage to a variation of the reference control voltage is greater than 0 and less than 1, that is, the variation of the target control voltage is less than the variation of the reference control voltage. In this way, the target control voltage is applied to the voltage-controlled oscillator, so that a variation of the frequency of the output signal of the voltage-controlled oscillator is small, that is, it may be understood that a frequency-to-voltage conversion rate of the voltage-controlled oscillator is equivalently reduced. It can be learned from a conclusion of a stability principle of the phase-locked loop circuit that a larger frequency-to-voltage conversion rate of the voltage-controlled oscillator indicates larger in-band noise of the phase-locked loop. The foregoing adjustment of the reference control voltage by the third voltage control module, especially the adjustment of the high-frequency component of the reference control voltage, can equivalently reduce the frequency-to-voltage conversion rate of the voltage-controlled oscillator, so that in-band noise of the phase-locked loop can be reduced, further improving quality of the output signal of the phase-locked loop.

In a possible implementation, the first voltage control module includes a charge pump, a first resistor, and a first capacitor. The first resistor and the first capacitor form a low-pass filter. An input end of the charge pump is coupled to an input end of the first voltage control module, an output end of the charge pump is connected to a first end of the first resistor, a second end of the first resistor is connected to a first end of the first capacitor, a second end of the first capacitor is grounded, and the second end of the first resistor and the first end of the first capacitor are coupled to the output end of the first voltage control module.

Specifically, a first input end of the charge pump is coupled to the input end of the first voltage control module, and a second input end of the charge pump is coupled to the input end of the first voltage control module. The upper signal (that is, the UP signal) output by the phase frequency detector is input to the first input end of the charge pump, and the down signal (that is, the DN signal) output by the phase frequency detector is input to the second input end of the charge pump.

It should be understood that the first voltage control module includes the charge pump and the low-pass filter (formed by the first resistor and the first capacitor). When the upper signal output by the phase frequency detector is a high-level signal, and the down signal output by the phase frequency detector is a low-level signal, the charge pump injects a charge into the low-pass filter to generate the charge current. When the upper signal is a low-level signal and the down signal is a high-level signal, the charge pump extracts a charge from the low-pass filter to generate the discharge current. The low-pass filter is specifically configured to filter out the high-frequency component of the charge current or the discharge current, and output the low-frequency component of the reference control voltage.

In this embodiment of this application, when the UP signal is a high-level signal and the DN signal is a low-level signal, the charge pump injects a charge into the low-pass filter formed by the first resistor and the first capacitor, so that a voltage output by the low-pass filter is increased, that is, a voltage (the voltage is the low-frequency component of the reference control voltage) output by the first voltage control module is increased. When the UP signal is a low-level signal and the DN signal is a high-level signal, the charge pump extracts a charge from the low-pass filter formed by the first resistor and the first capacitor, so that a voltage output by the low-pass filter is decreased, that is, a voltage (the voltage is the low-frequency component of the reference control voltage) output by the first voltage control module is decreased.

In the foregoing first voltage control module, a path formed by the charge pump and the low-pass filter formed by the first resistor and the first capacitor is referred to as an integration path. Through analysis, a gain of the integration path is denoted as:

$$G_{INT} = \frac{I_{CP}}{2\pi} * \frac{1}{C_1 * S},$$

where $G_{INT}$ is the gain of the integration path, $I_{CP}$ is a current of the charge pump, $C_1$ is a capacitance value of the first capacitor, and S represents a frequency domain variable.

In the first voltage control module, the first resistor and the first capacitor form a very large time constant (the time constant is a product of a resistance value of the first resistor and the capacitance value of the first capacitor), so that the first voltage control module mainly outputs the low-frequency component of the reference control voltage, that is, the low-frequency component of the reference control voltage is mainly affected by the first voltage control module, and impact of the second voltage control module on the low-frequency component of the reference control voltage may be ignored. In addition, power supply noise of the charge pump CP may be filtered out by the first resistor and the first capacitor.

In a possible implementation, the second voltage control module includes a buffer, an inverter, a second resistor, a second capacitor, a third resistor, and a third capacitor. An input end of the buffer is coupled to the first input end of the second voltage control module, an output end of the buffer is connected to a first end of the second resistor, a second end of the second resistor is connected to a first end of the second capacitor, an input end of the inverter is coupled to the second input end of the second voltage control module, an output end of the inverter is connected to a first end of the third resistor, a second end of the third resistor is connected to a first end of the third capacitor, and a second end of the second capacitor and a second end of the third capacitor are coupled to the output end of the second voltage control module.

In this embodiment of this application, a function of the buffer is mainly to shape a signal and increase drive power of the signal, so that a loading capability of the signal can be improved. A function of the inverter is to implement inversion of a high level and a low level of a signal (that is, inversion of a high-level signal into a low-level signal, or inversion of a low-level signal into a high-level signal), and increase drive power of the signal. The buffer and the inverter are digital logic devices, which are insensitive to the noise.

In this embodiment of this application, the buffer, the second resistor, and the second capacitor form a first branch, and the inverter, the third resistor, and the third capacitor form a second branch. The upper signal (that is, the UP signal) output by the phase frequency detector is processed by the buffer on the first branch to obtain a target upper signal, and the target upper signal is filtered by the second resistor and the second capacitor on the first branch to obtain an average value of the target upper signal. The down signal output by the phase frequency detector is processed by the inverter on the second branch to obtain a target down signal, and the target down signal is filtered by the second resistor and the second capacitor on the second branch to obtain an average value of the target down signal. The average value of the target upper signal is coupled to the average value of the target down signal to obtain the high-frequency component of the reference control voltage. The high-frequency component of the reference control voltage increases as the high-level duration of the upper signal increases, and the high-frequency component of the reference control voltage decreases as the high-level duration of the down signal increases.

For the first branch, the UP signal is connected to the input end of the buffer to obtain an UP2 signal, and the second resistor and the second capacitor form a low-pass filter to filter the UP2 signal to obtain an average value of the UP2 signal. For the foregoing second branch, the DN signal is connected to the input end of the inverter to obtain a DN2 signal, and the third resistor and the third capacitor form a low-pass filter to filter the DN2 signal to obtain an average value of the DN2 signal. The buffer can ensure that the average value of the UP2 signal increases as high-level duration of the UP signal increases, and decreases as the high-level duration of the UP signal decreases. The inverter can ensure that the average value of the DN2 signal decreases as high-level duration of the DN signal increases, and increases as the high-level duration of the DN signal decreases.

A sum of the average value of the UP2 signal and the average value of the DN2 signal is the high-frequency component of the reference control voltage output by the second voltage control module, that is, the second voltage control module performs coupling processing on the UP signal and the DN signal to obtain the high-frequency component of the reference control voltage. In other words, the high-frequency component of the reference control voltage varies with the high-level duration of the UP signal and the high-level duration of the DN signal.

A path formed by the second voltage control module is referred to as a proportional path. Through analysis, a gain of the proportional path is denoted as:

$$G_{PRO} = \frac{C_2}{2\pi*(C_2+C_1)}*V_{DD} \cong \frac{C_2}{2\pi*C_1}*V_{DD},$$

where $G_{PRO}$ is the gain of the proportional path, $C_1$ is a capacitance value of the first capacitor, $C_2$ is a capacitance value of the second capacitor, and the capacitance value of the second capacitor may be far less than the capacitance value of the first capacitor. When the capacitance value of the second capacitor is far less than the capacitance value of the first capacitor, in the denominator in the foregoing formula, the capacitance value of the second capacitor may be ignored. In this embodiment of this application, capacitance values of the second capacitor and the third capacitor are equal, and $V_{DD}$ is a power supply voltage of the buffer and the inverter.

With reference to the gain of the integration path and the gain of the proportional path, a sum of the gains of the integration path and the proportional path is:

$$G_{sum} = G_{INT} + G_{PRO} = \frac{C_2*V_{DD}*S + I_{CP}}{2\pi C_1*S}*V_{DD}$$

In the foregoing formula, assuming that the numerator is zero, a zero frequency of the phase-locked loop may be obtained as follows:

$$\omega_Z = \frac{I_{CP}}{2\pi}*\frac{1}{C_2*V_{DD}}$$

It can be learned that, in this embodiment of this application, the zero frequency of the phase-locked loop is unrelated to a capacitor (that is, the first capacitor) in the integration path. Compared with the current technology, the zero frequency does not need to be reduced by increasing the capacitance value of the first capacitor in the low-pass filter, so that the zero frequency is far less than bandwidth of the phase-locked loop, and then the phase-locked loop works stably. Therefore, the area of the phase-locked loop is not increased when an actual use requirement is satisfied. In an implementation, the capacitance value of the first capacitor may be decreased as much as possible, so that the area of the phase-locked loop is reduced. In conclusion, according to the phase-locked loop circuit provided in the embodiments of this application, noise of the phase-locked loop can be effectively reduced without increasing the area of the phase-locked loop and quality of the output signal of the phase-locked loop can be improved.

In a possible implementation, the third voltage control module includes a fourth resistor, a fourth capacitor, and a fifth capacitor. A first end of the fourth resistor and a first end of the fourth capacitor are coupled to the input end of the third voltage control module, a second end of the fourth capacitor is connected to a first end of the fifth capacitor, a second end of the fifth capacitor is grounded, and a second end of the fourth resistor, a second end of the fourth capacitor, and a first end of the fifth capacitor are coupled to the output end of the third voltage control module.

The target control voltage also includes a low-frequency component and a high-frequency component. The low-frequency component of the target control voltage is provided by the fourth resistor in the third voltage control module, that is, the low-frequency component of the reference control voltage output by the first voltage control module is processed by the fourth resistor to obtain the low-frequency component of the target control voltage. The high-frequency component of the target control voltage is provided through coupling by the fourth capacitor and the fifth capacitor in the third voltage control module, that is, the high-frequency component of the target control voltage is obtained after coupling processing, by the fourth capacitor and the fifth capacitor, the high-frequency component of the reference control voltage output by the second voltage control module.

A relationship between the high-frequency component of the target control voltage output by the third voltage control module and the high-frequency component of the reference control voltage output by the second voltage control module satisfies the following formula:

$$VCTRL = \frac{C4}{C4 + C5} * VCTRL\_PRE,$$

where

VCTRL is the high-frequency component of the target control voltage output by the third voltage control module, VCTRL_PRE is the high-frequency component of the reference control voltage output by the second voltage control module, C4 is a capacitance value of the fourth capacitor, C5 is a capacitance value of the fifth capacitor, and C4 is less than C5. The high-frequency component of the target control voltage is obtained by using the foregoing formula, and the high-frequency component is input to the input end of the voltage-controlled oscillator.

In this embodiment of this application, in the unit time, the variation of the target control voltage affects the frequency of the output signal of the voltage-controlled oscillator. Correspondingly, the variation of the target control voltage also includes a variation of the low-frequency component and a variation of the high-frequency component. The variation of the low-frequency component of the target control voltage is the same as a variation of the low-frequency component of the reference control voltage, and the variation of the high-frequency component of the target control voltage is different from a variation of the high-frequency component of the reference control voltage. Specifically, the high-frequency component of the target control voltage is $$\frac{C4}{C4 + C5}$$

times the high-frequency component of the reference control voltage, and therefore the variation of the high-frequency component of the target control voltage is also $$\frac{C4}{C4 + C5}$$

times the variation of the high-frequency component of the reference control voltage.

In conclusion, the variation of the high-frequency component of the target control voltage is different from the variation of the high-frequency component of the reference signal, and therefore a frequency of an output signal of a control voltage (that is, the target control voltage) of the voltage-controlled oscillator changes in the unit time, that is, it is equivalent to that the frequency-to-voltage conversion rate of the voltage-controlled oscillator changes. Specifically, the frequency-to-voltage conversion rate of the voltage-controlled oscillator is reduced by $$\frac{C4 + C5}{C4}$$

times, so that in-band noise of the phase-locked loop can be reduced, further improving quality of the output signal of the phase-locked loop.

In a possible implementation, the voltage-controlled oscillator includes a transistor and a ring oscillator. A gate of the transistor is coupled to the input end of the voltage-controlled oscillator, a source of the transistor is connected to a power supply, a drain of the transistor is connected to a first end of the ring oscillator, a second end of the ring oscillator is grounded, and a third end of the ring oscillator is coupled to an output end of the voltage-controlled oscillator.

In this embodiment of this application, the transistor provides a current source (specifically, a direct current) for the ring oscillator. The target control voltage is input to the gate of the transistor, and then the direct current is output from the drain of the transistor to the first end of the ring oscillator. A magnitude of the direct current output from the drain of the transistor varies with a magnitude of a voltage input to the gate of the transistor.

Optionally, the transistor in this embodiment of this application is an N-channel metal oxide semiconductor (MOS) transistor.

Optionally, in this embodiment of this application, the transistor in the voltage-controlled oscillator may also use a P-channel MOS transistor. When the P-channel MOS transistor is used, a connection relationship between the transistor and the ring oscillator in the voltage-controlled oscillator is as follows: a gate of the transistor is coupled to the input end of the voltage-controlled oscillator, a source of the transistor is grounded, a first end of the ring oscillator is connected to a power supply, a second end of the ring oscillator is connected to a drain of the transistor, and a third end of the ring oscillator is coupled to the output end of the voltage-controlled oscillator.

In this embodiment of this application, the foregoing component that provides the current for the ring oscillator may alternatively be another component that can provide a current source (that is, may not be the P-channel MOS transistor or the N-channel MOS transistor). This is not specifically limited.

In a possible implementation, the phase-locked loop circuit provided in this embodiment of this application further includes a power module, the power module is a low dropout linear regulator, the low dropout linear regulator is connected to the buffer and the inverter, and the low dropout linear regulator provides power supply to the buffer and the inverter.

Alternatively, the power module may be another power module that can supply power to the buffer and the inverter. This is specifically selected based on an actual requirement. This is not limited in this embodiment of this application.

DESCRIPTION OF EMBODIMENTS

Figure 1:
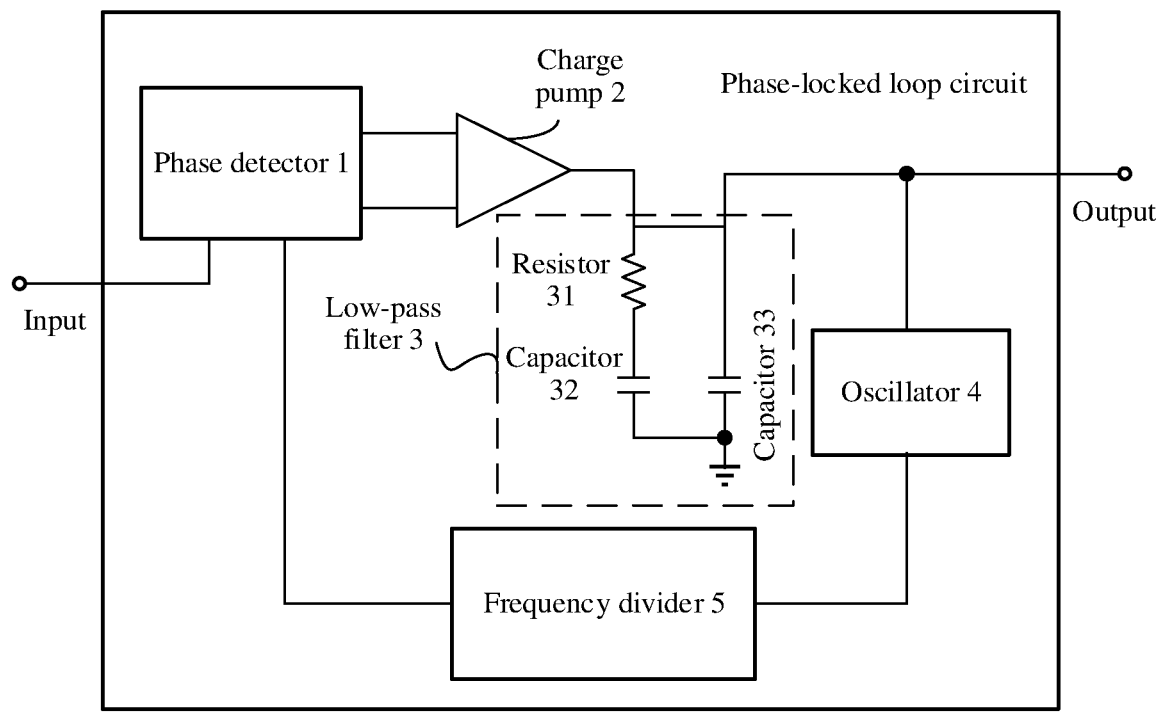
FIG. 1 is an example schematic diagram 1 of a phase-locked loop circuit according to an embodiment of this application.

In embodiments of this application, the terms "first", "second", "third" and so on are intended to distinguish between different objects but do not indicate a particular order of the objects. For example, a first resistor, a second resistor, a third resistor, and the like are used to distinguish between different resistors, but are not used to describe a specific sequence of the different resistors; and a first capacitor, a second capacitor, a third capacitor, and the like are used to distinguish between different capacitors, but are not used to describe a specific sequence of the different capacitors.

In addition, in embodiments of this application, the word "an example" or "for example" is used to represent giving an example, an illustration, or a description. Any embodiment or design scheme described as an "example" or "for example" in embodiments of this application should not be explained as being more preferred or having more advantages than another embodiment or design scheme. Exactly, use of the word "an example" or "for example" or the like is intended to present a relative concept in a specific manner.

In the description of the embodiment of this application, unless otherwise stated, "a plurality of" means two or more than two. For example, a plurality of processing units refer to two or more processing units. A plurality of systems refer to two or more systems.

First, some concepts related to a phase-locked loop circuit provided in the embodiments of the present technology are described.

A phase-locked loop is a feedback control circuit that locks a phase, and can make a phase difference between an input signal (an externally input reference signal) and a feedback signal to remain stable. In this embodiment of the present technology, both the input signal and the feedback signal are clock signals. In an operating process of the phase-locked loop circuit, a frequency and a phase of an oscillation signal inside the loop are controlled by using the externally input reference signal, to implement a frequency of an output signal to automatically track a frequency of an input signal, so that both the frequency and the phase of the oscillation signal maintain a fixed relationship with those of the input signal.

A phase frequency detector is configured to detect a frequency difference and a phase difference between two signals input to the phase frequency detector, and output two pulse control signals. One pulse control signal may be referred to as an upper signal (UP signal for short), and the other pulse signal may be referred to as a down signal (DN signal for short). The UP signal may be at a high level or a low level, and the DN signal may also be at a high level or a low level. Specifically, when the UP signal is at a high level, the DN signal is at a low level (it should be understood that the DN signal may be at a high level in a short time after the UP signal changes to a high level, and then changes to a low level), and vice versa, when the DN signal is at a high level, the UP signal is at a low level (it should be understood that the UP signal may be at a high level in a short time after the DN signal changes to a high level, and then changes to a low level). In this embodiment of this application, the phase frequency detector is configured to detect a phase difference between an input signal and a feedback signal.

A charge pump is also referred to as a switched capacitor voltage converter, and is an apparatus that uses a current mirror to quickly charge and discharge a capacitor to change an output voltage.

A voltage-controlled oscillator, namely an electric voltage-controlled oscillator, means that there is an oscillation circuit (VCO) between a frequency of an output signal and an input control voltage (that is, an input voltage), that is, the frequency of the output signal is a function of the input control voltage. The voltage-controlled oscillator may also be referred to as a frequency modulator, and is configured to generate a frequency modulation signal. It should be understood that, in the phase-locked loop circuit, the input control voltage is a voltage generated by an error signal, and the voltage-controlled oscillator is a controlled component in the phase-locked loop circuit.

An important parameter of the voltage-controlled oscillator is a frequency-to-voltage conversion rate. The frequency-to-voltage conversion rate refers to a variation of an output frequency of the oscillator under a unit input voltage change. The frequency-to-voltage conversion rate of the voltage-controlled oscillator may be denoted as: Kvco=$\Delta$f/$\Delta$V, where Kvco represents the frequency-to-voltage conversion rate, $\Delta$f is a variation of the frequency of the output signal, and $\Delta$V represents a variation of the input voltage.

A frequency divider is configured to perform frequency division on a frequency of a signal input to the frequency divider, to obtain a signal at an expected frequency. An important parameter of the frequency divider is a frequency division ratio. The frequency division ratio is a ratio of a frequency of an input signal to a frequency of an output signal of the frequency divider.

FIG. 1 shows a phase-locked loop circuit. The phase-locked loop circuit includes a phase detector 1, a charge pump 2, a low-pass filter 3, an oscillator 4, and a frequency divider 5. The low-pass filter 3 includes a resistor 31, a capacitor 32, and a capacitor 33 (a specific connection manner is shown in FIG. 1). The phase detector 1 may detect a phase difference between an input signal and a feedback signal, and output an upper signal (UP signal for short) and a down signal (DN signal for short). The UP signal and the DN signal are used as input signals of the charge pump 2. Under the control of the UP signal and the DN signal, the charge pump 2 extracts a charge from the low-pass filter 3 or injects a charge to the low-pass filter 3, and the charge passes through the low-pass filter 3 to form a control voltage of the oscillator 4. The control voltage controls a frequency of an output signal of the oscillator 4. The frequency divider 5 performs frequency division on the output signal of the oscillator 4 to obtain the feedback signal, and the feedback signal is fed back to the phase detector.

According to a loop stability principle of the phase-locked loop, a zero frequency of the phase-locked loop is far less than bandwidth of the phase-locked loop, and the bandwidth of the phase-locked loop cannot be set too high either. In the phase-locked loop circuit shown in FIG. 1, the zero frequency of the phase-locked loop is related to a filter resistor and a filter capacitor in the low-pass filter, and is specifically denoted as:

$$\omega_Z = \frac{1}{R*C_1},$$

where $\omega_Z$ is the zero frequency of the phase-locked loop, R is a resistance value of the filter resistor, and $C_1$ is a capacitance value of the filter capacitor. The bandwidth of the phase-locked loop is related to an output current of the charge pump, the filter resistor, a frequency-to-voltage conversion rate of the oscillator, and a frequency division ratio of the frequency divider, and is specifically denoted as:

$$BW = I_{CP}*R*\frac{K_{VCO}}{N_{DIV}*2\pi},$$

where BW is the bandwidth of the phase-locked loop, $I_{CP}$ is the output current of the charge pump, R is a resistance value of the filter resistor, $K_{VCO}$ is the frequency-to-voltage conversion rate of the oscillator, and $N_{DIV}$ is the frequency division ratio of the frequency divider. With reference to the foregoing formula, the capacitance value of the filter capacitor and/or the resistance value of the filter resistor may be increased to make the zero frequency $\omega_Z$ of the phase-locked loop smaller, and a larger capacitance value of the filter capacitor may make an area of the entire phase-locked loop circuit to increase, resulting in higher manufacturing costs of the phase-locked loop. Therefore, if the area of the phase-locked loop is not increased, the resistance value of the filter resistor may be increased to decrease $\omega_Z$. However, when the resistance value of the filter resistor is increased, the bandwidth of the phase-locked loop is accordingly increased. In this way, when the resistance value of the filter resistor is increased, the output current of the charge pump may be decreased to ensure that the bandwidth of the phase-locked loop is not increased. However, the decreasing of the output current of the charge pump may increase in-band noise of the phase-locked loop, resulting in poor stability of the phase-locked loop.

An embodiment of this application provides a phase-locked loop circuit, which may be used in a circuit (including but not limited to a phase-locked loop circuit and a clock recovery circuit) for frequency tracking. The phase-locked loop circuit includes a phase frequency detector, a first voltage control module, a second voltage control module, a third voltage control module, a voltage-controlled oscillator, and a frequency divider. A first output end of the phase frequency detector is connected to a first input end of the first voltage control module and a first input end of the second voltage control module, a second output end of the phase frequency detector is connected to a second input end of the first voltage control module and a second input end of the second voltage control module, an output end of the first voltage control module and an output end of the second voltage control module are separately connected to an input end of the third voltage control module, an output end of the third voltage control module is connected to an input end of the voltage-controlled oscillator, an output end of the voltage-controlled oscillator is connected to an input end of the frequency divider, and an output end of the frequency divider is connected to an input end of the phase frequency detector. The phase frequency detector may output an upper signal from the first output end of the phase frequency detector based on an input reference signal and an input feedback signal, and output a down signal from the second output end of the phase frequency detector. The first voltage control module outputs a low-frequency component of a reference control voltage based on the upper signal and the down signal. The second voltage control module outputs a high-frequency component of the reference control voltage based on the upper signal and the down signal. Further, the third voltage control module adjusts the high-frequency component and the low-frequency component of the reference control voltage to obtain a target control voltage, where the target control voltage is processed by the voltage-controlled oscillator and the frequency divider to obtain the feedback signal. According to the phase-locked loop circuit provided in this application, noise of the phase-locked loop can be effectively reduced without affecting quality of an output signal of the phase-locked loop, so that the quality of the output signal of the phase-locked loop can be improved.

The following describes in detail the phase-locked loop circuit provided in an embodiment of this application.

Figure 2:
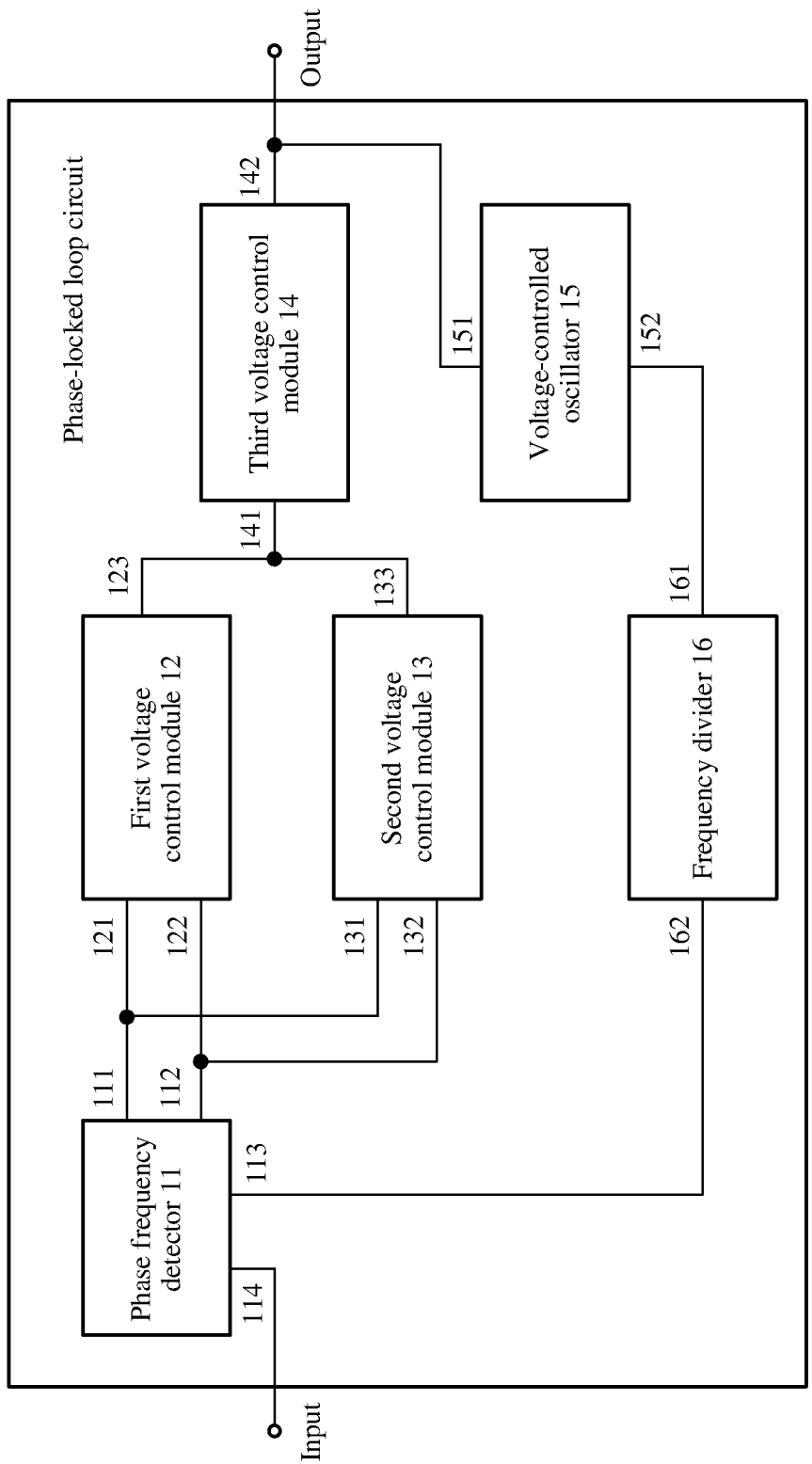
FIG. 2 is an example schematic diagram 2 of a phase-locked loop circuit according to an embodiment of this application.

As shown in FIG. 2, an embodiment of this application provides a phase-locked loop circuit. The phase-locked loop circuit includes a phase frequency detector 11, a first voltage control module 12, a second voltage control module 13, a third voltage control module 14, a voltage-controlled oscillator 15, and a frequency divider 16. A first output end 111 of the phase frequency detector 11 is connected to a first input end 121 of the first voltage control module 12 and a first input end 131 of the second voltage control module 13, a second output end 112 of the phase frequency detector 11 is connected to a second input end 122 of the first voltage control module 12 and a second input end 132 of the second voltage control module 13, an output end 123 of the first voltage control module 12 and an output end 133 of the second voltage control module 13 are separately connected to an input end 141 of the third voltage control module 14, an output end 142 of the third voltage control module 14 is connected to an input end 151 of the voltage-controlled oscillator 15, an output end 152 of the voltage-controlled oscillator 15 is connected to an input end 161 of the frequency divider 16, and an output end 162 of the frequency divider 16 is connected to an input end 113 of the phase frequency detector 11. An input end 114 of the phase frequency detector is an input end of the phase-locked loop circuit, a reference signal is input to the input end 114, and the output end 142 of the third voltage control module 14 is an output end of the phase-locked loop circuit.

The phase frequency detector 11 is configured to output an upper signal (briefly referred to as an UP signal in the following embodiments) from the first output end 111 of the phase frequency detector 11 based on an input reference signal and an input feedback signal, and output a down signal (briefly referred to as a DN signal in the following embodiments) from the second output end 112 of the phase frequency detector 11. The first voltage control module 12 is configured to output a low-frequency component of a reference control voltage based on the upper signal and the down signal. The second voltage control module 13 is configured to output a high-frequency component of the reference control voltage based on the upper signal and the down signal. The third voltage control module 14 is configured to adjust the high-frequency component of the reference control voltage and the low-frequency component of the reference control voltage to obtain a target control voltage, where the target control voltage is processed by the voltage-controlled oscillator 15 and the frequency divider 16 to obtain the feedback signal.

In this embodiment of this application, the phase frequency detector 11 is specifically configured to detect a phase difference between the input reference signal and the input feedback signal, output the upper signal from the first output end 111 of the phase frequency detector 11, and output the down signal from the second output end 112 of the phase frequency detector 11.

The first voltage control module 12 is specifically configured to generate, driven by the upper signal and the down signal, a charge current or a discharge current, filter out a high-frequency component of the charge current or the discharge current, and output the low-frequency component of the reference control voltage.

The second voltage control module 13 is specifically configured to perform coupling processing on the upper signal and the down signal, and output the high-frequency component of the reference control voltage, where the coupling processing enables the high-frequency component of the reference control voltage to increase as high-level duration of the upper signal increases, and enables the high-frequency component of the reference control voltage to decrease as the high-level duration of the down signal increases.

It should be understood that, under an action of the third voltage control module 14, a ratio of a variation of the target control voltage to a variation of the reference control voltage is greater than 0 and less than 1.

The voltage-controlled oscillator 15 is configured to control a frequency of an output signal of the voltage-controlled oscillator 15 based on the target control voltage. The frequency divider 16 is configured to perform frequency division on the output signal of the voltage-controlled oscillator 15 to obtain the feedback signal.

In this embodiment of this application, a signal input from the input end 114 of the phase-locked loop circuit (that is, the input end 114 of the phase frequency detector) is an external reference signal (referred to as a reference signal for short below), a frequency of the reference signal remains unchanged, and the phase-locked loop circuit is mainly configured to adjust a frequency of the feedback signal, so that the phase difference between the reference signal and the feedback signal remains stable.

In one case, when the frequency of the feedback signal output by the frequency divider 16 is higher than the frequency of the reference signal, a phase of the feedback signal is ahead of that of the reference signal. In this case, the upper signal (that is, the UP signal) output by the phase frequency detector 11 is a low-level signal, and the low signal (that is, the DN signal) output by the phase frequency detector 11 is a high-level signal.

In this embodiment of this application, when the phase difference between the feedback signal and the reference signal is large because the frequency of the feedback signal is higher than the frequency of the reference signal, the UP signal is a low-level signal, and the DN signal is a high-level signal. On one hand, the UP signal and the DN signal are input to the first voltage control module 12. Because the UP signal is a low-level signal and the DN signal is a high-level signal, the first voltage control module 12 generates the discharge current based on the UP signal and the DN signal, and filters out the high-frequency component of the discharge current, and output the low-frequency component of the reference control voltage. Because the discharge current is generated based on the UP signal and the DN signal, the low-frequency component of the reference control voltage is decreased compared with that before (for example, before a period of time). On the other hand, the UP signal and the DN signal are input to the second voltage control module 13 for coupling processing to output the high-frequency component of the reference control voltage, where the coupling processing enables the high-frequency component of the reference control voltage to increase as high-level duration of the UP signal increases, and enables the high-frequency component of the reference control voltage to decrease as the high-level duration of the DN signal increases. Because the UP signal is a low-level signal, and the DN signal is a high-level signal, the high-frequency component of the reference control voltage output by the second voltage control module is reduced compared with that before (for example, before a certain period of time). In this way, after the first voltage control module 12 and the second voltage control module 13 respectively obtain the low-frequency component of the reference control voltage and the high-frequency component of the reference control voltage, the third voltage control module 14 adjusts the reference control voltage to obtain the target control voltage, where the target control voltage is reduced compared with that before (because the low-frequency component of the reference control voltage is reduced compared with that before, and the high-frequency component of the reference control voltage is also reduced compared with that before). Therefore, under the control of the target control voltage, the frequency of the output signal of the voltage-controlled oscillator 15 is reduced, and the frequency of the feedback signal output by the frequency divider 16 is further reduced. In this way, the phase difference between the feedback signal and the reference signal is reduced.

The foregoing is a process of adjusting, by the phase-locked loop circuit, the phase difference between the feedback signal and the reference signal when the phase difference between the feedback signal and the reference signal is large because the frequency of the feedback signal of the phase-locked loop circuit is large.

In another case, when the frequency of the feedback signal output by the frequency divider 16 is lower than the frequency of the reference signal, a phase of the feedback signal is behind that of the reference signal. In this case, the upper signal (that is, the UP signal) output by the phase frequency detector 11 is a high-level signal, and the low signal (that is, the DN signal) output by the phase frequency detector 11 is a low-level signal.

In this embodiment of this application, when the phase difference between the feedback signal and the reference signal is large because the frequency of the feedback signal is lower than the frequency of the reference signal, the UP signal is a high-level signal, and the DN signal is a low-level signal. On one hand, the UP signal and the DN signal are input to the first voltage control module 12. Because the UP signal is a high-level signal and the DN signal is a low-level signal, the first voltage control module 12 generates the charge current based on the UP signal and the DN signal, and filters out the high-frequency component of the charge current, and output the low-frequency component of the reference control voltage. Because the charge current is generated based on the UP signal and the DN signal, the low-frequency component of the reference control voltage is increased compared with that before (for example, before a period of time). On the other hand, the UP signal and the DN signal are input to the second voltage control module 13 for coupling processing to output the high-frequency component of the reference control voltage, where the coupling processing enables the high-frequency component of the reference control voltage to increase as high-level duration of the UP signal increases, and enables the high-frequency component of the reference control voltage to decrease as the high-level duration of the DN signal increases. Because the UP signal is a high-level signal, and the DN signal is a low-level signal, the high-frequency component of the reference control voltage output by the second voltage control module is increased compared with that before (for example, before a certain period of time). In this way, after the first voltage control module 12 and the second voltage control module 13 respectively obtain the low-frequency component of the reference control voltage and the high-frequency component of the reference control voltage, the third voltage control module 14 adjusts the reference control voltage to obtain the target control voltage, where the target control voltage is increased compared with that before (because the low-frequency component of the reference control voltage is increased compared with that before, and the high-frequency component of the reference control voltage is also increased compared with that before). Therefore, under the control of the target control voltage, the frequency of the output signal of the voltage-controlled oscillator 15 is increased, and the frequency of the feedback signal output by the frequency divider 16 is further increased. In this way, the phase difference between the feedback signal and the reference signal is reduced.

The foregoing is a process of adjusting, by the phase-locked loop circuit, the phase difference between the feedback signal and the reference signal when the phase difference between the feedback signal and the reference signal is large because the frequency of the feedback signal of the phase-locked loop circuit is small.

It should be noted that, in this embodiment of this application, the low-frequency component of the reference control voltage is mainly provided by the first voltage control module 12. In this case, impact of the second voltage control module 13 on the low-frequency component of the reference control voltage may be ignored. The high-frequency component of the reference control voltage is mainly provided by the second voltage control module 13. In this case, impact of the first voltage control module 12 on the high-frequency component of the reference control voltage may be ignored.

It should be understood that noise of the phase-locked loop circuit includes noise caused by a high-frequency signal and noise caused by a low-frequency signal. The noise caused by the low-frequency signal may usually be attenuated by the phase-locked loop circuit to filter out, that is, the noise caused by the low-frequency signal in the phase-locked loop circuit may be ignored. In other words, it is considered that the noise caused by the low-frequency signal does not affect quality of the output signal of the phase-locked loop circuit. In this embodiment of this application, the low-frequency component and the high-frequency component of the reference control voltage in the phase-locked loop are separately output by using different voltage control circuits. The second voltage control module 13 performs coupling processing on the UP signal and the DN signal to output the high-frequency component of the reference control voltage, and then the high-frequency component is adjusted by the third voltage control module 14, so that the noise caused by the high-frequency signal (that is, the high-frequency component) can be better suppressed. In conclusion, according to the phase-locked loop circuit provided in this embodiment of this application, noise of the phase-locked loop can be effectively reduced, and quality of the output signal of the phase-locked loop can be improved. In addition, the phase-locked loop circuit provided in this embodiment of this application does not increase an area of the phase-locked loop. In addition, in a specific implementation, the area of the phase-locked loop may be reduced by adjusting a parameter of an electronic component in the phase-locked loop circuit, to facilitate implementation of an integration process. In conclusion, according to the technical solutions provided in the embodiments of this application, noise of the phase-locked loop can be effectively reduced without increasing the area of the phase-locked loop, and stability of the output signal of the phase-locked loop can be improved.

Further, a fluctuation of the reference control voltage (which is a fluctuation or a variation in a unit time in this embodiment of this application) affects the frequency of the output signal of the voltage-controlled oscillator 15. In the third voltage control module 14, the target control voltage fluctuates with the fluctuation of the reference control voltage, and a ratio of a variation of the target control voltage to a variation of the reference control voltage is greater than 0 and less than 1, that is, the variation of the target control voltage is less than the variation of the reference control voltage. In this way, the target control voltage is applied to the voltage-controlled oscillator 15, so that a variation of the frequency of the output signal of the voltage-controlled oscillator 15 is small, that is, it may be understood that a frequency-to-voltage conversion rate of the voltage-controlled oscillator is equivalently reduced. It can be learned from a conclusion of a stability principle of the phase-locked loop circuit that a larger frequency-to-voltage conversion rate of the voltage-controlled oscillator indicates larger in-band noise of the phase-locked loop. The foregoing adjustment of the reference control voltage by the third voltage control module 14, especially the adjustment of the high-frequency component of the reference control voltage, can equivalently reduce the frequency-to-voltage conversion rate of the voltage-controlled oscillator, so that in-band noise of the phase-locked loop can be reduced, further improving quality of the output signal of the phase-locked loop.

Figure 3:
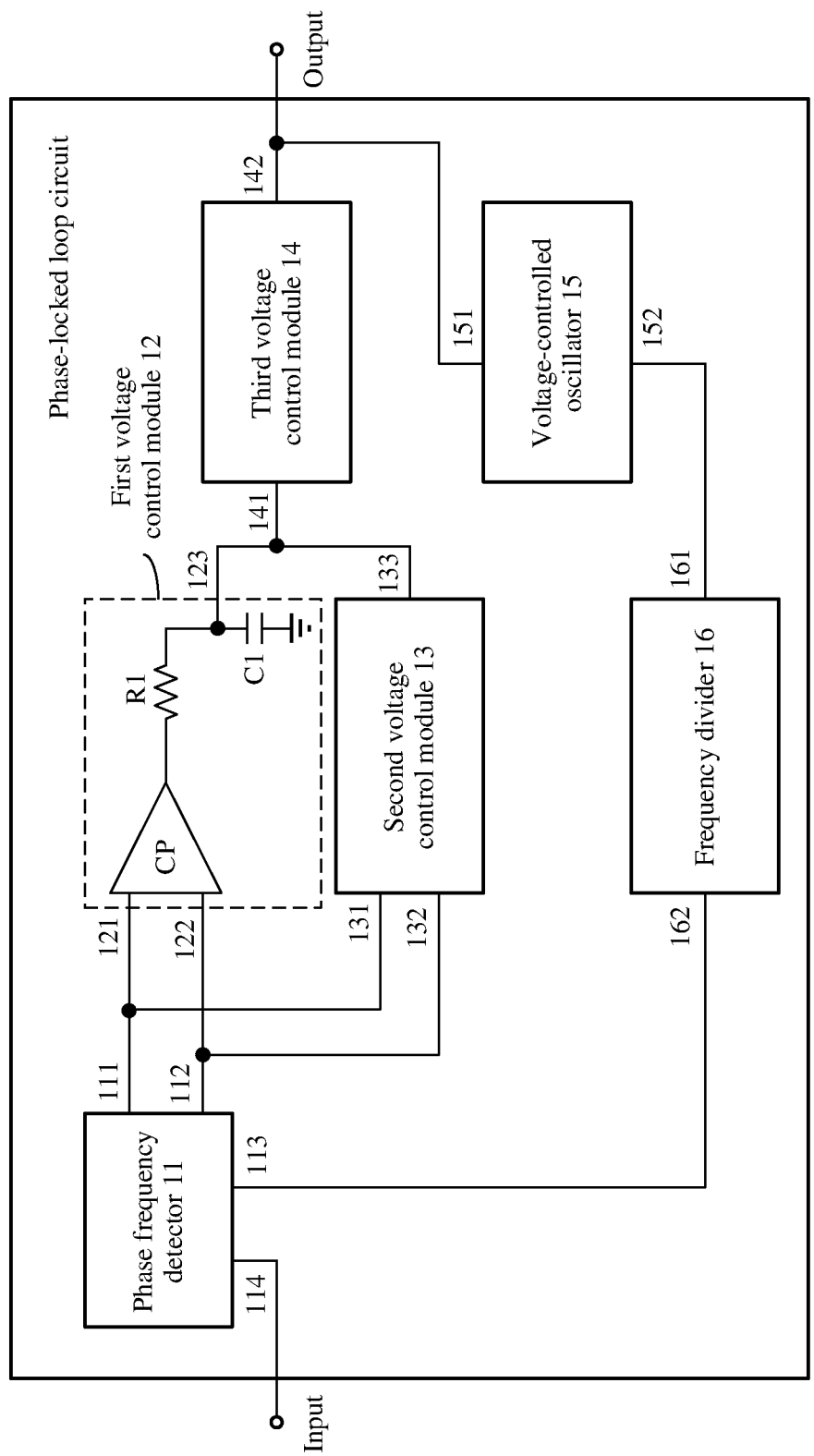
FIG. 3 is an example schematic diagram 3 of a phase-locked loop circuit according to an embodiment of this application.

In an implementation, with reference to FIG. 2, as shown in FIG. 3, the first voltage control module 12 in the phase-locked loop circuit provided in this embodiment of this application includes a charge pump CP, a first resistor R1, and a first capacitor C1. The first resistor R1 and the first capacitor C1 form a low-pass filter. An input end of the charge pump CP is coupled to an input end of the first voltage control module 12, an output end of the charge pump CP is connected to a first end of the first resistor R1, a second end of the first resistor R1 is connected to a first end of the first capacitor C1, and a second end of the first capacitor C1 is grounded, a second end of the first resistor R1 and a first end of the first capacitor C1 are coupled to an output end 123 of the first voltage control module 12.

Specifically, a first input end of the charge pump CP is coupled to the input end 121 of the first voltage control module 12, and a second input end of the charge pump CP is coupled to the input end 122 of the first voltage control module 12. The upper signal (that is, the UP signal) output by the phase frequency detector 11 is input to the first input end of the charge pump CP, and the down signal (that is, the DN signal) output by the phase frequency detector 11 is input to the second input end of the charge pump CP.

It should be understood that the first voltage control module 12 includes the charge pump CP and the low-pass filter (formed by the first resistor R1 and the first capacitor C1). When the upper signal output by the phase frequency detector 11 is a high-level signal, and the down signal output by the phase frequency detector 11 is a low-level signal, the charge pump CP injects a charge into the low-pass filter to generate the charge current. When the upper signal is a low-level signal and the down signal is a high-level signal, the charge pump CP extracts a charge from the low-pass filter to generate the discharge current. The low-pass filter is specifically configured to filter out the high-frequency component of the charge current or the discharge current, and output the low-frequency component of the reference control voltage.

In this embodiment of this application, when the UP signal is a high-level signal and the DN signal is a low-level signal, the charge pump CP injects a charge into the low-pass filter formed by the first resistor R1 and the first capacitor C1, so that a voltage output by the low-pass filter is increased, that is, a voltage (the voltage is the low-frequency component of the reference control voltage) output by the first voltage control module 12 is increased. When the UP signal is a low-level signal and the DN signal is a high-level signal, the charge pump CP extracts a charge from the low-pass filter formed by the first resistor R1 and the first capacitor C1, so that a voltage output by the low-pass filter is decreased, that is, a voltage (the voltage is the low-frequency component of the reference control voltage) output by the first voltage control module 12 is decreased.

In the foregoing first voltage control module 12, a path formed by the charge pump CP and the low-pass filter formed by the first resistor R1 and the first capacitor C1 is referred to as an integration path. Through analysis, a gain of the integration path is denoted as:

$$G_{INT} = \frac{I_{CP}}{2\pi} * \frac{1}{C_1 * S},$$

where $G_{INT}$ is the gain of the integration path, $I_{CP}$ is a current of the charge pump CP, $C_1$ is a capacitance value of the first capacitor C1, and S represents a frequency domain variable.

In the first voltage control module 12, the first resistor R1 and the first capacitor C1 form a very large time constant (the time constant is a product of a resistance value of the first resistor R1 and a capacitance value of the first capacitor C1), so that the first voltage control module 12 mainly outputs the low-frequency component of the reference control voltage, that is, the low-frequency component of the reference control voltage is mainly affected by the first voltage control module 12, and impact of the second voltage control module 13 on the low-frequency component of the reference control voltage may be ignored. In addition, power supply noise of the charge pump CP may be filtered out by the first resistor R1 and the first capacitor C1.

Figure 4:
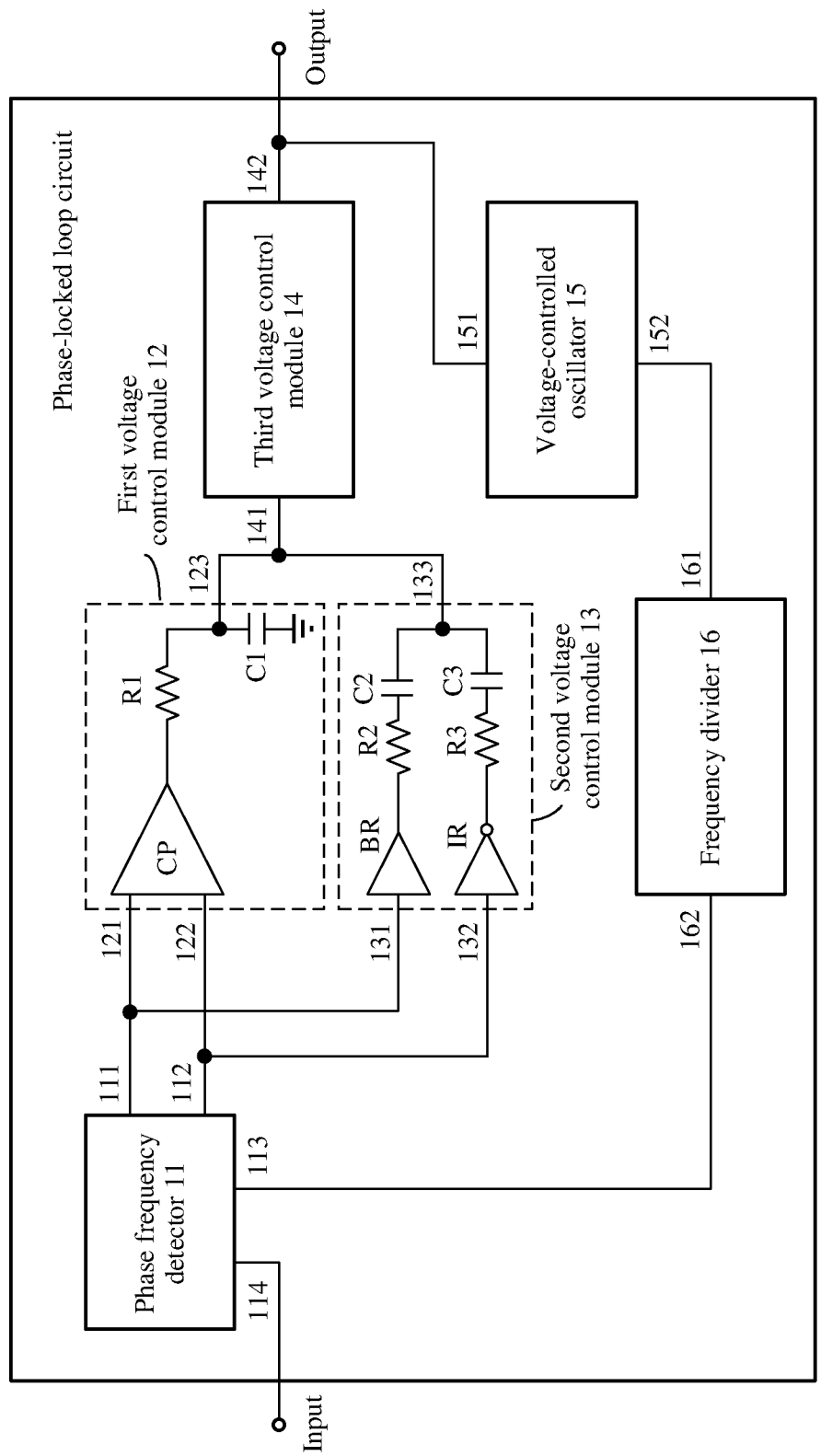
FIG. 4 is an example schematic diagram 4 of a phase-locked loop circuit according to an embodiment of this application.

In an implementation, with reference to FIG. 3, as shown in FIG. 4, the second voltage control module 13 in the phase-locked loop circuit provided in this embodiment of this application includes a buffer BR, an inverter IR, a second resistor R2, a second capacitor C2, a third resistor R3, and a third capacitor C3. An input end of the buffer BR is coupled to the first input end 131 of the second voltage control module 13, an output end of the buffer BR is connected to a first end of the second resistor R2, a second end of the second resistor R2 is connected to a first end of the second capacitor C2, an input end of the inverter IR is coupled to the second input end 132 of the second voltage control module 13, an output end of the inverter IR is connected to a first end of the third resistor R3, a second end of the third resistor R3 is connected to a first end of the third capacitor C3, and a second end of the second capacitor C2 and a second end of the third capacitor C3 are coupled to the output end 133 of the second voltage control module 13.

It can be understood that, in this embodiment of this application, a function of the buffer BR is mainly to shape a signal and increase drive power of the signal, so that a loading capability of the signal can be improved. A function of the inverter IR is to implement inversion of a high level and a low level of a signal (that is, inversion of a high-level signal into a low-level signal, or inversion of a low-level signal into a high-level signal), and increase drive power of the signal. The buffer BR and the inverter IR are digital logic devices, which are insensitive to the noise.

In this embodiment of this application, with reference to FIG. 4, the buffer BR, the second resistor R2, and the second capacitor C2 form a first branch, and the inverter IR, the third resistor R3, and the third capacitor C3 form a second branch. The upper signal (that is, the UP signal) output by the phase frequency detector 11 is processed by the buffer on the first branch to obtain a target upper signal, and the target upper signal is filtered by the second resistor and the second capacitor on the first branch to obtain an average value of the target upper signal. The down signal (that is, the DN signal) output by the phase frequency detector 11 is processed by the inverter on the second branch to obtain a target down signal, and the target down signal is filtered by the second resistor and the second capacitor on the second branch to obtain an average value of the target down signal. The average value of the target upper signal is coupled to the average value of the target down signal to obtain the high-frequency component of the reference control voltage. The high-frequency component of the reference control voltage increases as the high-level duration of the upper signal increases, and the high-frequency component of the reference control voltage decreases as the high-level duration of the down signal increases.

For the first branch, the UP signal is connected to the input end of the buffer BR to obtain an UP2 signal, and the second resistor R2 and the second capacitor C2 form a low-pass filter to filter the UP2 signal to obtain an average value of the UP2 signal. For the foregoing second branch, the DN signal is connected to the input end of the inverter IR to obtain a DN2 signal, and the third resistor R3 and the third capacitor C3 form a low-pass filter to filter the DN2 signal to obtain an average value of the DN2 signal.

Figure 5:
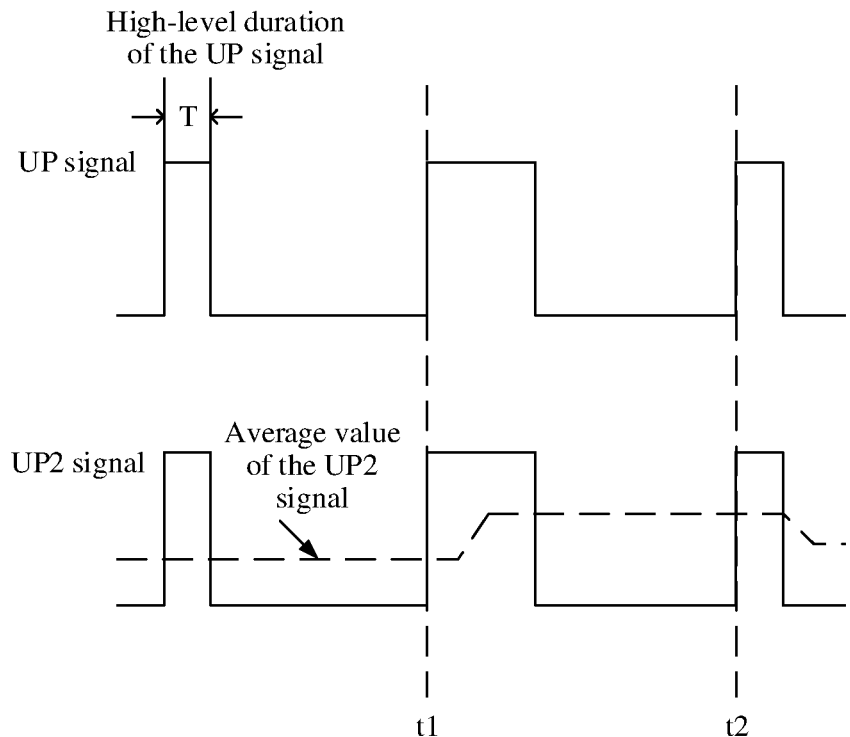
FIG. 5 is an example schematic diagram 1 of a signal change according to an embodiment of this application.

In the foregoing first branch, the buffer BR may ensure that the average value of the UP2 signal increases as the high-level duration of the UP signal increases and decreases as the high-level duration of the UP signal decreases. For example, as shown in FIG. 5, starting from a time t1, the high-level duration of the UP signal increases compared with the previous duration, the high-level duration of the UP2 signal also increases, and it can be learned that the average value of the UP2 signal increases; and starting from a moment t2, the high-level duration of the UP signal is reduced compared with the previous duration, the high-level duration of the UP2 signal is also reduced, and it can be learned that the average value of the UP2 signal is reduced.

Figure 6:
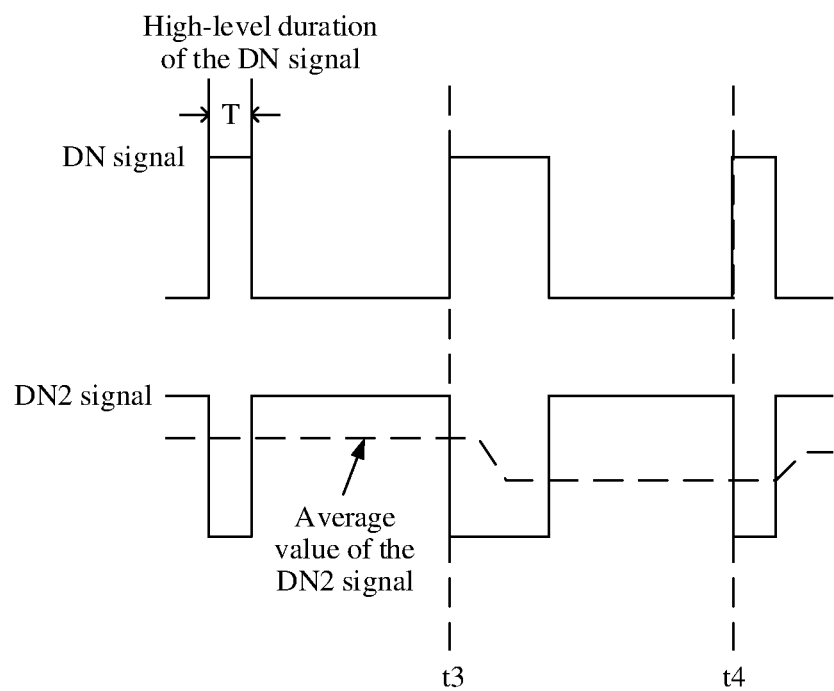
FIG. 6 is an example schematic diagram 2 of a signal change according to an embodiment of this application.

In the foregoing second branch, the inverter IR can ensure that the average value of the DN2 signal decreases as the high-level duration of the DN signals increases and increases as the high-level duration of the DN signal decreases. For example, as shown in FIG. 6, starting from a moment t3, the high-level duration of the DN signal increases compared with the previous duration, the low-level duration of the DN2 signal increases, and it can be learned that the average value of the DN2 decreases; and starting from a moment t4, the high-level duration of the DN is reduced compared with the previous duration, the low-level duration of the DN2 signal is also reduced, and it can be learned that the average value of the DN2 signal is increased.

It should be understood that a sum of the average value of the UP2 signal and the average value of the DN2 signal is the high-frequency component of the reference control voltage output by the second voltage control module 13, that is, the second voltage control module performs coupling processing on the UP signal and the DN signal to obtain the high-frequency component of the reference control voltage. In other words, the high-frequency component of the reference control voltage varies with the high-level duration of the UP signal and the high-level duration of the DN signal.

A path formed by the second voltage control module 13 is referred to as a proportional path. Through analysis, a gain of the proportional path is denoted as:

$$G_{PRO} = \frac{C_2}{2\pi*(C_2+C_1)} * V_{DD} \cong \frac{C_2}{2\pi*C_1} * V_{DD},$$

where $G_{PRO}$ is the gain of the proportional path, $C_1$ is a capacitance value of the first capacitor C1, $C_2$ is a capacitance value of the second capacitor C2, and the capacitance value of the second capacitor C2 may be far less than the capacitance value of the first capacitor C1. When the capacitance value of the second capacitor C2 is far less than the capacitance value of the first capacitor C1, in the denominator in the foregoing formula, the capacitance value of the second capacitor C2 may be ignored. In this embodiment of this application, capacitance values of the second capacitor C2 and the third capacitor C3 are equal, and $V_{DD}$ is a power supply voltage of the buffer BR and the inverter IR.

With reference to the gain of the integration path and the gain of the proportional path, a sum of the gains of the integration path and the proportional path is:

$$G_{sum} = G_{INT} + G_{PRO} = \frac{C_2*V_{DD}*S+I_{CP}}{2\pi C_1 * S} * V_{DD}$$

In the foregoing formula, assuming that the numerator is zero, a zero frequency of the phase-locked loop may be obtained as follows:

$$\omega_Z = \frac{I_{CP}}{2\pi} * \frac{1}{C_2*V_{DD}}$$

It can be learned that, in this embodiment of this application, the zero frequency of the phase-locked loop is unrelated to a capacitor (that is, the first capacitor C1) in the integration path. Compared with the current technology, the zero frequency does not need to be reduced by increasing the capacitance value of the first capacitor C1 in the low-pass filter, so that the zero frequency is far less than bandwidth of the phase-locked loop, and then the phase-locked loop works stably. Therefore, the area of the phase-locked loop is not increased when an actual use requirement is satisfied. In an implementation, the capacitance value of the first capacitor C1 may be decreased as much as possible, so that the area of the phase-locked loop is reduced. In conclusion, according to the phase-locked loop circuit provided in the embodiments of this application, noise of the phase-locked loop can be effectively reduced without increasing the area of the phase-locked loop and quality of the output signal of the phase-locked loop can be improved.

Figure 7:
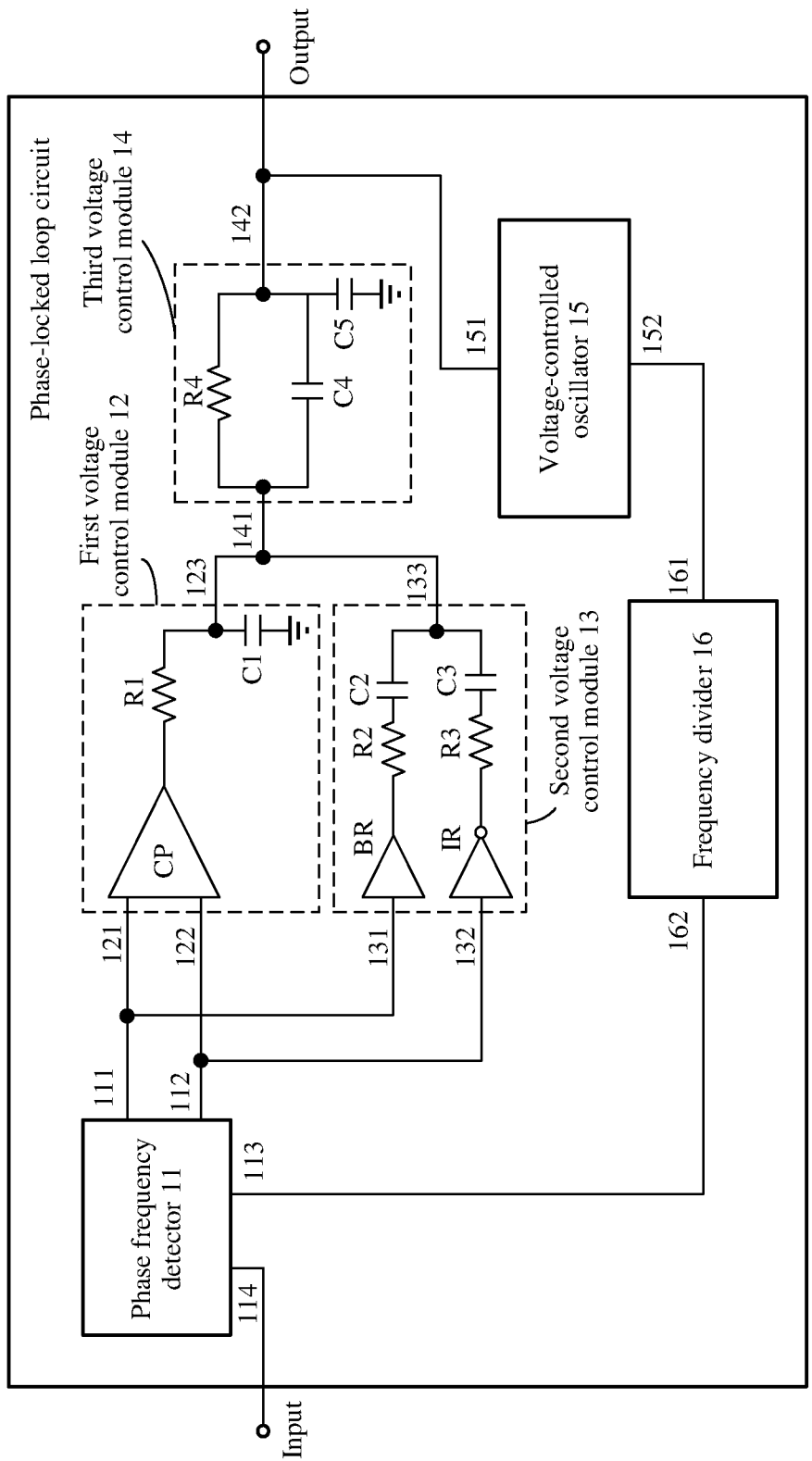
FIG. 7 is an example schematic diagram 5 of a phase-locked loop circuit according to an embodiment of this application.

In an implementation, with reference to FIG. 4, as shown in FIG. 7, the third voltage control module 14 in the phase-locked loop circuit provided in this embodiment of this application includes a fourth resistor R4, a fourth capacitor C4, and a fifth capacitor C5. A first end of the fourth resistor R4 and a first end of the fourth capacitor C4 are coupled to the input end 141 of the third voltage control module 14, a second end of the fourth capacitor C4 is connected to a first end of the fifth capacitor C5, a second end of the fifth capacitor C5 is grounded, and a second end of the fourth resistor R4, a second end of the fourth capacitor C4, and a first end of the fifth capacitor C5 are coupled to the output end 142 of the third voltage control module 14.

Based on the description of the foregoing embodiment, it may be understood that the target control voltage includes a low-frequency component and a high-frequency component. The low-frequency component of the target control voltage is provided by the fourth resistor R4 in the third voltage control module 14, that is, the low-frequency component of the reference control voltage output by the first voltage control module 12 is processed by the fourth resistor R4 to obtain the low-frequency component of the target control voltage. The high-frequency component of the target control voltage is provided through coupling by the fourth capacitor C4 and the fifth capacitor C5 in the third voltage control module 14, that is, the high-frequency component of the target control voltage is obtained after coupling processing, by the fourth capacitor C4 and the fifth capacitor C5, the high-frequency component of the reference control voltage output by the second voltage control module 13.

With reference to FIG. 7, a relationship between the high-frequency component of the target control voltage output by the third voltage control module 14 and the high-frequency component of the reference control voltage output by the second voltage control module 13 satisfies the following formula:

$$VCTRL = \frac{C4}{C4+C5} * VCTRL\_PRE,$$

where

VCTRL is the high-frequency component of the target control voltage output by the third voltage control module 14, VCTRL_PRE is the high-frequency component of the reference control voltage output by the second voltage control module 13, C4 is a capacitance value of the fourth capacitor C4, C5 is a capacitance value of the fifth capacitor C5, and C4 is less than C5. The high-frequency component of the target control voltage is obtained by using the foregoing formula, and the high-frequency component is input to the input end 151 of the voltage-controlled oscillator 15.

In this embodiment of this application, in the unit time, the variation of the target control voltage affects the frequency of the output signal of the voltage-controlled oscillator 15. Correspondingly, the variation of the target control voltage also includes a variation of the low-frequency component and a variation of the high-frequency component. The variation of the low-frequency component of the target control voltage is the same as a variation of the low-frequency component of the reference control voltage, and the variation of the high-frequency component of the target control voltage is different from a variation of the high-frequency component of the reference control voltage. Specifically, the high-frequency component of the target control voltage is $$\frac{C4}{C4+C5}$$

times the high-frequency component of the reference control voltage, and therefore the variation of the high-frequency component of the target control voltage is also $$\frac{C4}{C4+C5}$$

times the variation of the high-frequency component of the reference control voltage.

For example, assuming that the capacitance value of the fourth capacitor C4 is ⅑ of the capacitance value of the fifth capacitor C5, according to the formula satisfied by a relationship between VCTRL and VCTRL_PRE, if the VCTRL_PRE changes by 10 millivolts (mV), VCTRL changes by 1 mV.

In conclusion, the variation of the high-frequency component of the target control voltage is different from the variation of the high-frequency component of the reference signal, and therefore the frequency of the output signal of the control voltage (that is, the target control voltage) of the voltage-controlled oscillator 15 changes in the unit time, that is, it is equivalent to that the frequency-to-voltage conversion rate of the voltage-controlled oscillator 15 changes. Specifically, the frequency-to-voltage conversion rate of the voltage-controlled oscillator 15 is reduced by $$\frac{C4+C5}{C4}$$

times. For example, in the foregoing example, the frequency-to-voltage conversion rate decreases by 10 times, so that in-band noise of the phase-locked loop can be reduced, further improving quality of the output signal of the phase-locked loop.

It should be noted that, in this embodiment of this application, a resistance value of the fourth resistor R4 is a megaohm-level resistor. For example, the resistance value of the fourth resistor R4 is usually greater than 7 megaohms (Meg ohm). Specifically, selection is performed based on an actual situation, so that the phase-locked loop circuit remains stable. This is not limited herein.

Figure 8:
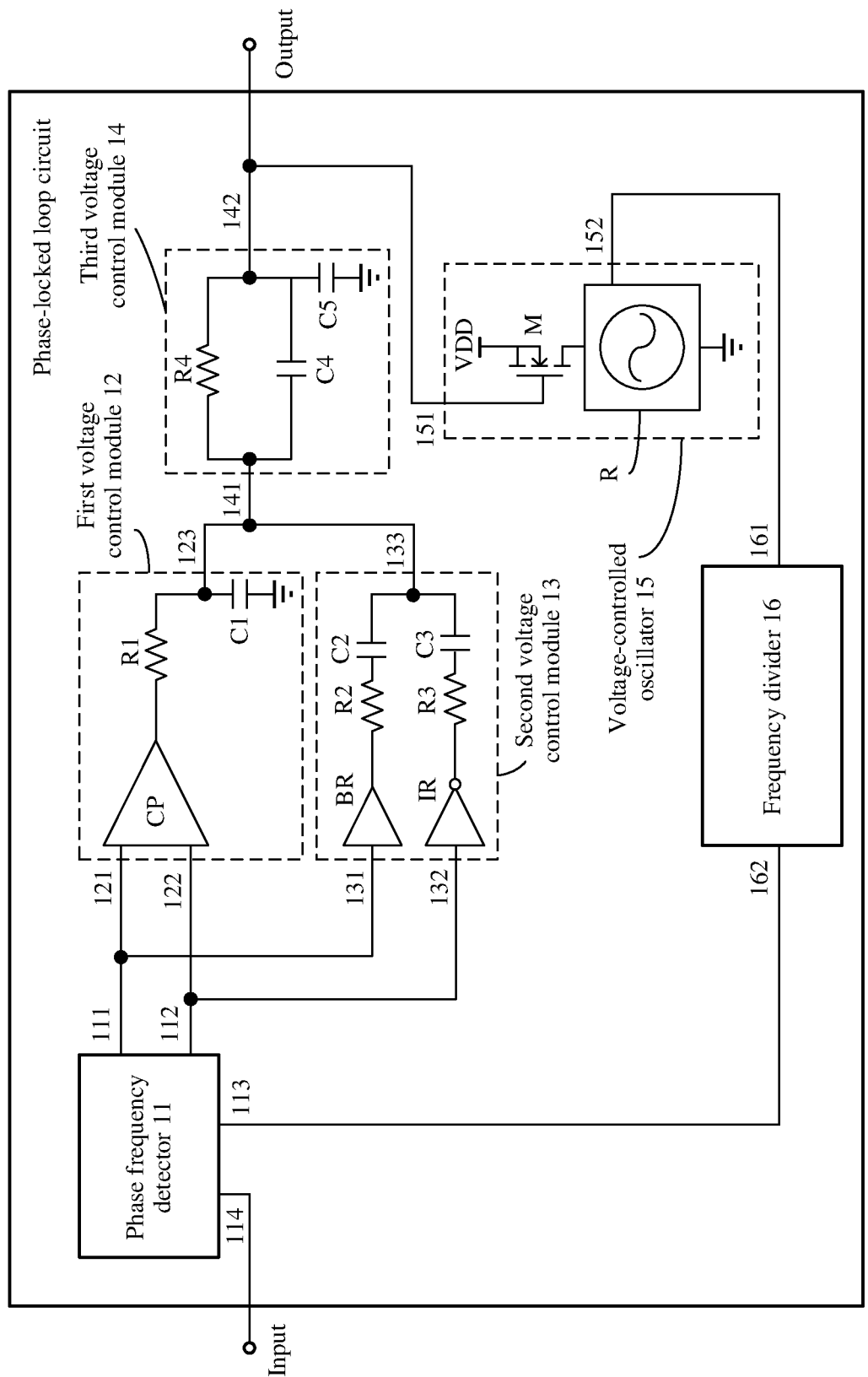
FIG. 8 is an example schematic diagram 6 of a phase-locked loop circuit according to an embodiment of this application.

In a possible implementation, with reference to FIG. 7, as shown in FIG. 8, the voltage-controlled oscillator 15 in the phase-locked loop circuit provided in this embodiment of this application includes a transistor M and a ring oscillator R. A gate of the transistor M is coupled to the input end 151 of the voltage-controlled oscillator 15, a source of the transistor M is connected to a power supply, a drain of the transistor M is connected to a first end of the ring oscillator R, a second end of the ring oscillator R is grounded, a third end of the ring oscillator R is coupled to the output end 152 of the voltage-controlled oscillator 15.

In this embodiment of this application, the transistor M provides a current source (specifically, a direct current) for the ring oscillator R. The target control voltage is input to the gate of the transistor M, and then the direct current is output from the drain of the transistor M to the first end of the ring oscillator. A magnitude of the direct current output from the drain of the transistor M varies with a magnitude of a voltage input to the gate of the transistor M.

Optionally, the transistor M in this embodiment of this application is an N-channel metal oxide semiconductor (MOS) transistor.

Figure 9:
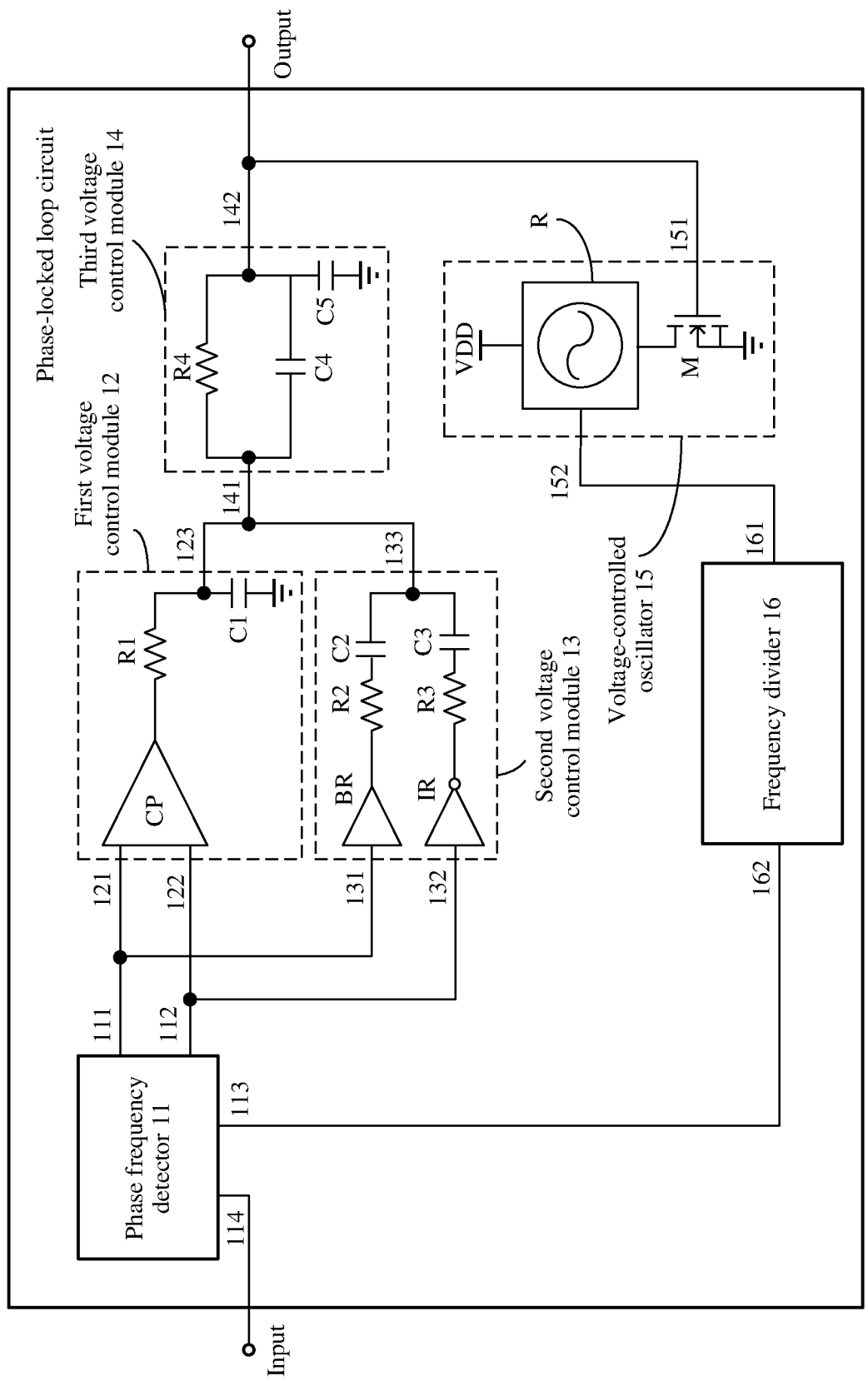
FIG. 9 is an example schematic diagram 7 of a phase-locked loop circuit according to an embodiment of this application.

Optionally, in this embodiment of this application, the transistor in the voltage-controlled oscillator may also use a P-channel MOS transistor. When the P-channel MOS transistor is used, as shown in FIG. 9, a connection relationship between the transistor M and the ring oscillator R in the voltage-controlled oscillator 15 is as follows: a gate of the transistor M is coupled to the input end 151 of the voltage-controlled oscillator 15, a source of the transistor M is grounded, a first end of the ring oscillator R is connected to a power supply, a second end of the ring oscillator R is connected to a drain of the transistor M, and a third end of the ring oscillator R is coupled to the output end 152 of the voltage-controlled oscillator 15.

Optionally, in this embodiment of this application, the component that provides the current for the ring oscillator may alternatively be another component that can provide a current source (that is, may not be the P-channel MOS transistor or the N-channel MOS transistor). This is not specifically limited.

Figure 10:
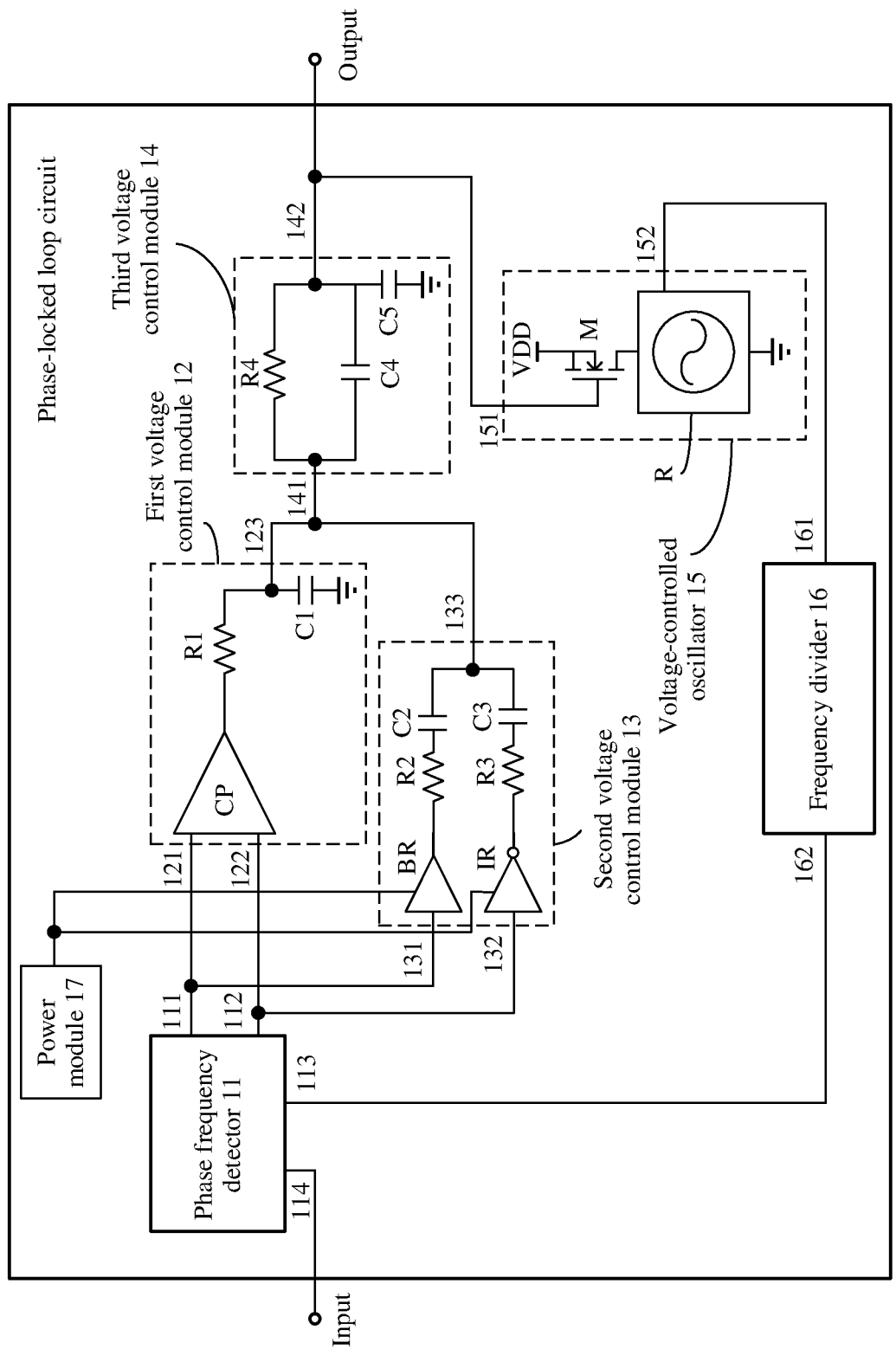
FIG. 10 is an example schematic diagram 8 of a phase-locked loop circuit according to an embodiment of this application.

In a possible implementation, with reference to FIG. 8, as shown in FIG. 10, the phase-locked loop circuit provided in this embodiment of this application further includes a power module 17, the power module 17 is a low dropout linear regulator, the low dropout linear regulator is connected to the buffer BR and the inverter IR, and the low dropout linear regulator provides power supply to the buffer BR and the inverter IR.

Optionally, the power module 17 may alternatively be another power module that can supply power to the buffer BR and the inverter IR. This is specifically selected based on an actual requirement. This is not limited in this embodiment of this application.

The foregoing descriptions are merely specific implementations of the present technology, but are not intended to limit the protection scope of the present technology. Any variation or replacement readily figured out by a person skilled in the art within the technical scope disclosed in the present technology shall fall within the protection scope of the present technology. Therefore, the protection scope of the present technology shall be subject to the protection scope of the claims.

What is claimed is:

1. A phase-locked loop circuit, comprising:
a phase frequency detector;
a first voltage control module;
a second voltage control module;
a third voltage control module;
a voltage-controlled oscillator; and
a frequency divider, wherein
a first output end of the phase frequency detector is connected to a first input end of the first voltage control module and a first input end of the second voltage control module,
a second output end of the phase frequency detector is connected to a second input end of the first voltage control module and a second input end of the second voltage control module,
an output end of the first voltage control module and an output end of the second voltage control module are separately connected to an input end of the third voltage control module,
an output end of the third voltage control module is connected to an input end of the voltage-controlled oscillator,
an output end of the voltage-controlled oscillator is connected to an input end of the frequency divider, and
an output end of the frequency divider is connected to an input end of the phase frequency detector, wherein
the phase frequency detector is configured to output an upper signal, from the first output end of the phase frequency detector, based on an input reference signal and an input feedback signal, and output a down signal from the second output end of the phase frequency detector,
the first voltage control module is configured to output a low-frequency component of a reference control voltage based on the upper signal and the down signal,
the second voltage control module is configured to output a high-frequency component of the reference control voltage based on the upper signal and the down signal,
the third voltage control module is configured to adjust the high-frequency component of the reference control voltage and the low-frequency component of the reference control voltage to obtain a target control voltage, and
the voltage-controlled oscillator and the frequency divider are configured to process the target control voltage to obtain a feedback signal.

2. The phase-locked loop circuit according to claim 1, wherein the first voltage control module is configured to:
generate a charge current or a discharge current driven by the upper signal and the down signal,
filter out a high-frequency component of the charge current or the discharge current, and
output the low-frequency component of the reference control voltage.

3. The phase-locked loop circuit according to claim 1, wherein the second voltage control module is configured to:
perform coupling processing on the upper signal and the down signal, and
output the high-frequency component of the reference control voltage, wherein
the coupling processing enables the high-frequency component of the reference control voltage to increase as high-level duration of the upper signal increases, and enables the high-frequency component of the reference control voltage to decrease as the high-level duration of the down signal increases.

4. The phase-locked loop circuit according to claim 1, wherein the phase frequency detector is configured to:
detect a phase difference between the reference signal and the feedback signal,
output the upper signal from the first output end of the phase frequency detector, and
output the down signal from the second output end of the phase frequency detector.

5. The phase-locked loop circuit according to claim 1, wherein
the voltage-controlled oscillator is configured to control a frequency of an output signal based on the target control voltage.

6. The phase-locked loop circuit according to claim 1, wherein
the frequency divider is configured to perform frequency division on the output signal of the voltage-controlled oscillator to obtain the feedback signal.

7. The phase-locked loop circuit according to claim 1, wherein the first voltage control module comprises:
a charge pump,
a first resistor, and
a first capacitor, wherein
the first resistor and the first capacitor form a low-pass filter,
an input end of the charge pump is coupled to an input end of the first voltage control module,
an output end of the charge pump is connected to a first end of the first resistor,
a second end of the first resistor is connected to a first end of the first capacitor,
a second end of the first capacitor is grounded, and
the second end of the first resistor and the first end of the first capacitor are coupled to the output end of the first voltage control module.

8. The phase-locked loop circuit according to claim 7, wherein
the first resistor and the first capacitor form the low-pass filter,
the input end of the charge pump comprises a first input end and a second input end,
the upper signal is input to the first input end of the charge pump,
the down signal is input to the second input end of the charge pump,
when the upper signal is a high-level signal and the down signal is a low-level signal:
injecting, by the charge pump, a charge into the low-pass filter to generate the charge current,
when the upper signal is a low-level signal and the down signal is a high-level signal:
extracting, by the charge pump, a charge from the low-pass filter to generate the discharge current, and
the low-pass filter is configured to filter out the high-frequency component of the charge current or the discharge current, and output the low-frequency component of the reference control voltage.

9. The phase-locked loop circuit according to claim 1, wherein the second voltage control module comprises
a buffer;
an inverter;
a second resistor;
a second capacitor;
a third resistor; and
a third capacitor, wherein
an input end of the buffer is coupled to the first input end of the second voltage control module,
an output end of the buffer is connected to a first end of the second resistor,
a second end of the second resistor is connected to a first end of the second capacitor,
an input end of the inverter is coupled to the second input end of the second voltage control module,
an output end of the inverter is connected to a first end of the third resistor,
a second end of the third resistor is connected to a first end of the third capacitor, and
a second end of the second capacitor and a second end of the third capacitor are coupled to the output end of the second voltage control module.

10. The phase-locked loop circuit according to claim 9, wherein
the buffer, the second resistor, and the second capacitor form a first branch,
the inverter, the third resistor, and the third capacitor form a second branch,
the upper signal is processed by the buffer on the first branch to obtain a target upper signal,
the target upper signal is filtered by the second resistor and the second capacitor on the first branch to obtain an average value of the target upper signal,
the down signal is processed by the inverter on the second branch to obtain a target down signal,
the target down signal is filtered by the second resistor and the second capacitor on the second branch to obtain an average value of the target down signal,
the average value of the target upper signal is coupled to the average value of the target down signal to obtain the high-frequency component of the reference control voltage, the high-frequency component of the reference control voltage increases as the high-level duration of the upper signal increases, and
the high-frequency component of the reference control voltage decreases as the high-level duration of the down signal increases.

11. The phase-locked loop circuit according to claim 1, wherein
the third voltage control module comprises a fourth resistor, a fourth capacitor, and a fifth capacitor,
a first end of the fourth resistor and a first end of the fourth capacitor are coupled to the input end of the third voltage control module,
a second end of the fourth capacitor is connected to a first end of the fifth capacitor,
a second end of the fifth capacitor is grounded, and
a second end of the fourth resistor, a second end of the fourth capacitor, and a first end of the fifth capacitor are coupled to the output end of the third voltage control module.

12. The phase-locked loop circuit according to claim 11, wherein
the target control voltage comprises a high-frequency component and a low-frequency component,
the low-frequency component of the target control voltage is obtained after processing the low-frequency component of the reference control voltage by the fourth resistor,
the high-frequency component of the target control voltage is obtained after coupling processing the high-frequency component of the reference control voltage by the fourth capacitor and the fifth capacitor, and
a relationship between the high-frequency component of the target control voltage and the high-frequency component of the reference control voltage satisfies the following formula:

$$VCTRL = \frac{C4}{C4 + C5} * VCTRL\_PRE,$$

wherein
VCTRL is the high-frequency component of the target control voltage, VCTRL_PRE is the high-frequency component of the reference control voltage, C4 is a capacitance value of the fourth capacitor, C5 is a capacitance value of the fifth capacitor, and C4<C5.

13. The phase-locked loop circuit according to claim 11, wherein
the fourth resistor is a megaohm-level resistor.

14. The phase-locked loop circuit according to claim 1, wherein
the voltage-controlled oscillator comprises a transistor and a ring oscillator,
a gate of the transistor is coupled to the input end of the voltage-controlled oscillator,
a source of the transistor is connected to a power supply,
a drain of the transistor is connected to a first end of the ring oscillator,
a second end of the ring oscillator is grounded,
a third end of the ring oscillator is coupled to the output end of the voltage-controlled oscillator, and
the transistor is an N-channel metal oxide semiconductor (MOS) transistor.

15. The phase-locked loop circuit according to claim 14, wherein
   the voltage-controlled oscillator comprises a transistor and a ring oscillator,
   a gate of the transistor is coupled to the input end of the voltage-controlled oscillator,
   a source of the transistor is grounded,
   a first end of the ring oscillator is connected to a power supply,
   a second end of the ring oscillator is connected to a drain of the transistor,
   a third end of the ring oscillator is coupled to the output end of the voltage-controlled oscillator, and
   the transistor is a P-channel MOS transistor.

16. The phase-locked loop circuit according to claim 9, further comprising:
   a power module, wherein
      the power module is a low dropout linear regulator,
      the low dropout linear regulator is connected to the buffer and the inverter, and
      the low dropout linear regulator provides power supply to the buffer and the inverter.

17. A phase-locked loop circuit, comprising:
   a phase frequency detector;
   a first voltage control module;
   a second voltage control module;
   a third voltage control module;
   a voltage-controlled oscillator; and
   a frequency divider, wherein
      the phase frequency detector is configured to output an upper signal, from a first output end, based on an input reference signal and an input feedback signal, and output a down signal from a second output end,
      the first voltage control module is configured to output a low-frequency component of a reference control voltage based on the upper signal and the down signal,
      the second voltage control module is configured to output a high-frequency component of the reference control voltage based on the upper signal and the down signal,
      the third voltage control module is configured to adjust the high-frequency component of the reference control voltage and the low-frequency component of the reference control voltage to obtain a target control voltage, and
      the voltage-controlled oscillator and the frequency divider are configured to process the target control voltage to obtain a feedback signal.

* * * * *